United States Patent
Enomoto

(10) Patent No.: US 7,202,743 B2
(45) Date of Patent: Apr. 10, 2007

(54) HIGH FREQUENCY AMPLIFIER

(75) Inventor: Shingo Enomoto, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 57 days.

(21) Appl. No.: 11/043,282

(22) Filed: Jan. 27, 2005

(65) Prior Publication Data

US 2005/0168287 A1   Aug. 4, 2005

(30) Foreign Application Priority Data

Feb. 2, 2004   (JP) ............. 2004-024949

(51) Int. Cl.
*H03F 1/30* (2006.01)
(52) U.S. Cl. ............... 330/290; 330/283
(58) Field of Classification Search ........... 330/290, 330/283, 298, 110
See application file for complete search history.

(56) References Cited

U.S. PATENT DOCUMENTS 5,907,180 A * 5/1999 Johansson et al. .......... 257/580

6,717,463 B2 * 4/2004 Aparin et al. ............... 330/149
2005/0062538 A1 * 3/2005 Herzberg et al. ........... 330/285

FOREIGN PATENT DOCUMENTS

JP   2003-273660   9/2003

* cited by examiner

*Primary Examiner*—Robert Pascal
*Assistant Examiner*—Hieu Nguyen
(74) *Attorney, Agent, or Firm*—Steptoe & Johnson LLP

(57) ABSTRACT

An emitter of a transistor (1) for high frequency amplification and a cathode of a diode (5) for generating reference voltage are grounded via an inductance (20). Anode electric potential of the diode (5) decreases with increase in output power of the transistor (1) and thus the operation of the transistor (1) is limited. Since the diode is an on linear element, it is possible to quickly limit the operation of the transistor (1) in response to an increase in output current, thereby preventing a breakdown caused by overcurrent.

13 Claims, 13 Drawing Sheets

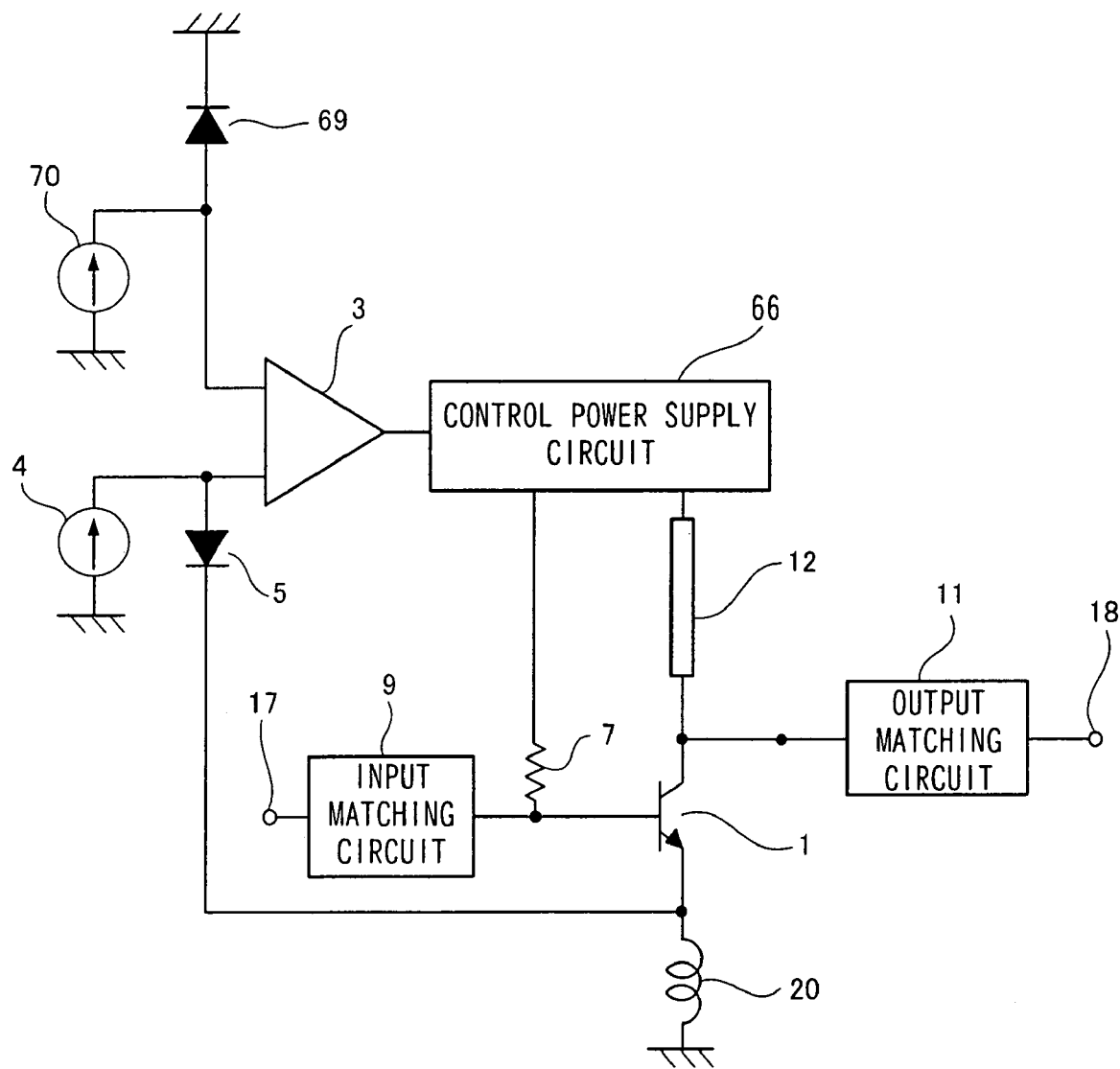
F I G. 1 6

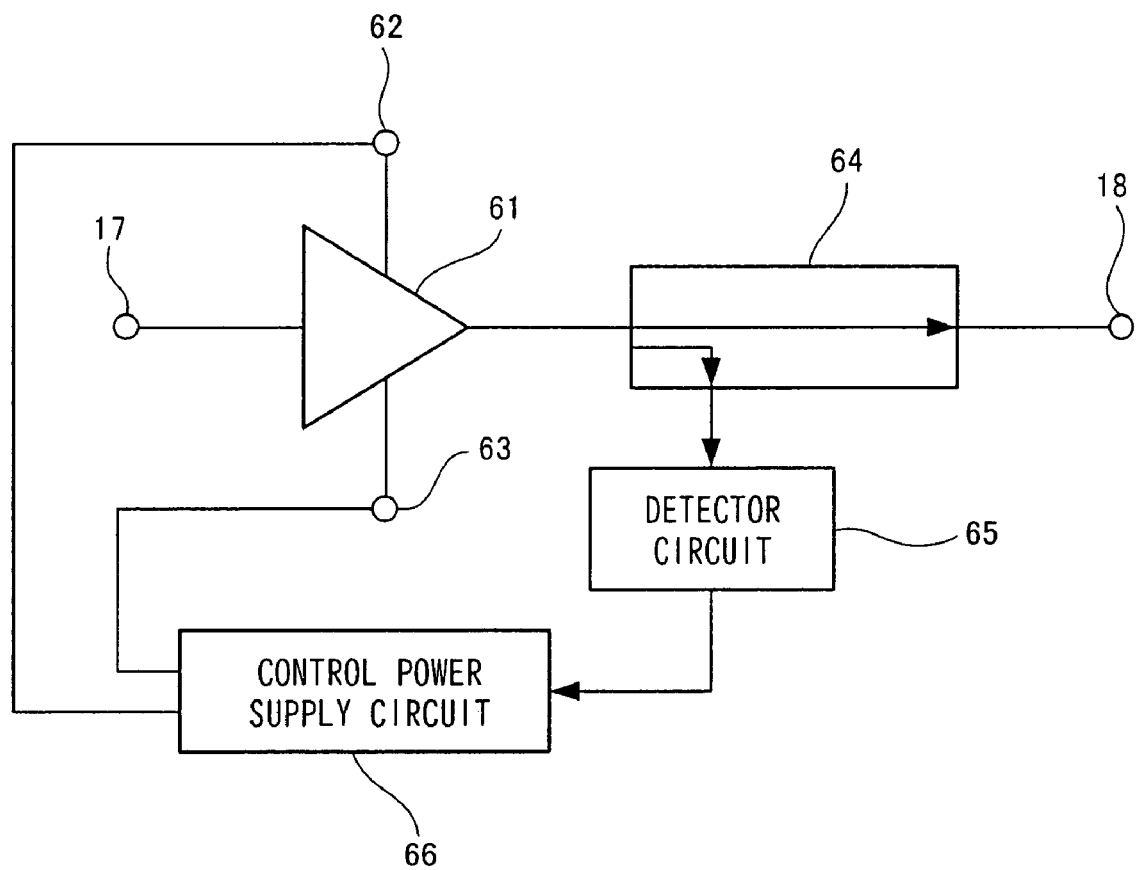

US 7,202,743 B2

HIGH FREQUENCY AMPLIFIER

FIELD OF THE INVENTION

The present invention relates to a high frequency amplifier using a high frequency transistor.

BACKGROUND OF THE INVENTION

In amplifiers used for radio communication of mobile telephones and so on, generally two or three compound semiconductor transistors for high frequency amplification are connected in multiple stages. In recent years, hetero bipolar transistors are mainly used as compound semiconductor transistors in consideration of a single positive power supply operation and so on.

When a current driving bipolar transistor is used for an amplifier having an output power of about 1 to 3 W for mobile telephone terminals, a bias circuit is generally used. The bias circuit includes, in addition to a bipolar transistor for high frequency amplification, another bipolar transistor which supplies a bias to the base of the transistor by means of an emitter follower. (see Japanese Patent Laid-Open No. 2003-273660).

Further, methods using a directional coupler and a detector circuit are generally used to detect an output power of an amplifier and control the bias voltage of the amplifier according to the output power.

FIG. 20 shows an example of a conventional high frequency amplifier.

A high frequency input signal is inputted from a high frequency power input terminal 17 to the base of a bipolar transistor 1 for high frequency amplification (hereinafter, referred to as a transistor 1), is outputted from the collector thereof, and is outputted from a high frequency power output terminal 18.

An input matching circuit 9 converts the input impedance of the transistor 1 into 50Ω. An output matching circuit 11 sets an impedance from the output of the transistor 1 so as to obtain a desired power for a load of 50Ω.

A bias is supplied from a voltage source 13 to the collector of the transistor 1 via a collector power supply circuit 12 such as a λ/4 wavelength line. Base bias is supplied from a voltage source 14 to the base of the transistor 1 by means of an emitter follower of a bipolar transistor 2 for bias supply. The bias current of the transistor 1 is adjusted according to the voltage of the voltage source 14 and a resistor 7. A resistor 8 suppresses excessive base current of the transistor 1.

Reference numeral 15 denotes a voltage source for supplying the collector bias of the bipolar transistor 2 for bias supply.

FIG. 21 shows that the output power and temperature dependence of the high frequency amplifier shown in FIG. 20 are improved by using the diode 5 for generating the reference voltage. To be specific, the base electric potential of the bipolar transistor 2 for bias supply is so adjusted by an operational amplifier 3 as to be equal to a voltage generated in the diode 5 for generating the reference voltage. The transistor 2 supplies base bias to the transistor 1 by means of the emitter follower and the diode 5 has been biased by a constant current source 4. The bias current of the transistor 1 is adjusted by the constant current source 4.

FIG. 22 shows an example of a high frequency amplifier having the function of adjusting the bias of a high frequency transistor according to an output power. A high frequency signal is inputted from a high frequency power input terminal 17. An output from a high frequency amplifier 61 passes through a directional coupler 64 and is outputted from a high frequency power output terminal 18. The output is partially inputted to a detector circuit 65 by the directional coupler 64. The output voltage of a control power supply circuit 66 is controlled for a desired characteristic according to the output level of the detector circuit 65. The voltage is supplied to a base or gate voltage supply terminal 62 and a collector or drain voltage supply terminal 63 of the high frequency amplifier 61.

However, in the case of the high frequency amplifier using the conventional bipolar transistor, when the output load of the high frequency amplifier fluctuates, the bipolar transistor for high frequency amplification rapidly increases in collector current and thus a breakdown may occur in the transistor.

Generally, a breakdown is prevented by the following methods:

1) A resistor is provided in the collector or emitter of a high frequency transistor.
2) A resistor is provided in the base of a high frequency transistor.
3) The size of a high frequency transistor is increased to have a higher allowable current.
4) The output power of a high frequency amplifier is detected and a bias voltage is controlled so as to prevent the occurrence of a breakdown in the high frequency amplifier at high output power.

However, in 1), power added efficiency is seriously reduced by a resistance loss in the high-power amplifier. In 3), power gain and power added efficiency decrease because the high frequency transistor increases in size. Further, a semiconductor chip increases in size.

Although method 2) is most commonly used, a voltage drop in the resistor is proportionate to a base current and thus a resistance value enough to prevent a breakdown in the event of fluctuations in output load degrades a characteristic in an actually used area. Method 4) requires a directional coupler and a detector circuit, so that a characteristic is degraded by a loss in the directional coupler and the detector circuit and the high frequency amplifier increases in size.

As described above, in the conventional art, when the collector current of an amplifier increases due to fluctuations in the output load of the amplifier, a breakdown may occur in a transistor. In order to prevent a breakdown, the high frequency characteristic of the amplifier degrades and the size of the amplifier increases.

It is an object of the present invention to provide a high frequency amplifier which can prevent a breakdown in a transistor without degrading the high frequency characteristic of the high frequency amplifier.

DISCLOSURE OF THE INVENTION

A high frequency amplifier according to the first aspect of the present invention, in which a high frequency input signal is applied between the ground and an input circuit of a transistor for high frequency amplification and a high frequency output signal is outputted from one end of an output circuit of the transistor for high frequency amplification, wherein the other end of the output circuit is connected to the ground via a sensor element serving as a load resistance component at the frequency of the high frequency input signal, and a terminal voltage of the sensor element is fed back to the input of a bias voltage regulator circuit of the input circuit via a nonlinear element to limit the operations of the output circuit.

A high frequency amplifier according to the second aspect of the present invention, in which an input circuit of a first transistor for high frequency amplification and an input circuit of a second transistor for high frequency amplification are connected in parallel, a high frequency input signal is applied between the ground and the input circuits of the first and second transistors for high frequency amplification, and a high frequency output signal is outputted from one end of an output circuit in each of the first and second transistors for high frequency amplification, the output circuits being connected in parallel, wherein out of the first and second transistors for high frequency amplification, the other end of the output circuit of the first transistor for high frequency amplification is grounded, the other end of the output circuit of the second transistor for high frequency amplification is connected to the ground via a sensor element serving as a load resistance component at the frequency of the high frequency input signal, and a terminal voltage of the sensor element is fed back to the input of a bias voltage regulator circuit of the input circuit in each of the first and second transistors for high frequency amplification via a nonlinear element to limit the operations of the output circuits.

A high frequency amplifier according to the third aspect of the present invention, in claim 1 or 2, wherein the sensor element is an inductance or resistor or a series circuit of an inductance and a resistor.

A high frequency amplifier according to the fourth aspect of the present invention, wherein according to the first aspect or the second aspect, the nonlinear element for feeding back the terminal voltage of the sensor element to the input of the bias voltage regulator circuit is a diode biased in the forward direction, and one end of the diode is grounded via a capacitor.

A high frequency amplifier according to the fifth aspect of the present invention, in which a high frequency input signal is applied between the ground and an input circuit of a transistor for high frequency amplification and a high frequency output signal is outputted from one end of an output circuit of the transistor for high frequency amplification, wherein the other end of the output circuit is connected to the ground via a sensor element serving as a load resistance component at the frequency of the high frequency input signal, a terminal voltage of the sensor element is fed back to the input of a bias voltage regulator circuit of the input circuit via a nonlinear element to limit the operations of the output circuit, the sensor element is constituted of an inductance or resistor or a series circuit of an inductance and a resistor, the nonlinear element for feeding back the terminal voltage of the sensor element to the input of the bias voltage regulator circuit is a diode biased in the forward direction, and one end of the diode is grounded via a capacitor.

A high frequency amplifier according to the sixth aspect of the present invention, in which an input circuit of a first transistor for high frequency amplification and an input circuit of a second transistor for high frequency amplification are connected in parallel, a high frequency input signal is applied between the ground and the input circuits of the first and second transistors for high frequency amplification, and a high frequency output signal is outputted from one end of an output circuit in each of the first and second transistors for high frequency amplification, the output circuits being connected in parallel, wherein out of the first and second transistors for high frequency amplification, the other end of the output circuit of the first transistor for high frequency amplification is grounded, the other end of the output circuit of the second transistor for high frequency amplification is connected to the ground via a sensor element serving as a load resistance component at the frequency of the high frequency input signal, a terminal voltage of the sensor element is fed back to the input of a bias voltage regulator circuit of the input circuit in each of the first and second transistors for high frequency amplification via a nonlinear element to limit the operations of the output circuits, the sensor element is constituted of an inductance or resistor or a series circuit of an inductance and a resistor, the nonlinear element for feeding back the terminal voltage of the sensor element to the input of the bias voltage regulator circuit is a diode biased in the forward direction, and one end of the diode is grounded via a capacitor.

A high frequency amplifier according to the seventh aspect of the present invention, wherein according to the first aspect or the second aspect, the nonlinear element for feeding back the terminal voltage of the sensor element to the input of the bias voltage regulator circuit is a first diode biased in the forward direction, a second diode biased in the forward direction with the grounded cathode is provided in addition to the first diode, and the terminal voltage is fed back to the input of the bias voltage regulator circuit of the input circuit according to an electric potential difference between the anode electric potential of the first diode and the anode electric potential of the second diode to limit the operations of the output circuit.

A high frequency amplifier according to the eighth aspect of the present invention, in which a high frequency input signal is applied between the ground and an input circuit of a transistor for high frequency amplification and a high frequency output signal is outputted from one end of an output circuit of the transistor for high frequency amplification, wherein the other end of the output circuit is connected to the ground via a sensor element serving as a load resistance component at the frequency of the high frequency input signal, a terminal voltage of the sensor element is fed back to the input of a bias voltage regulator circuit of the input circuit via a nonlinear element to limit the operations of the output circuit, the sensor element is constituted of an inductance or resistor or a series circuit of an inductance and a resistor, the nonlinear element for feeding back the terminal voltage of the sensor element to the input of the bias voltage regulator circuit is a first diode biased in the forward direction, a second diode biased in the forward direction with the grounded cathode is provided in addition to the first diode, and the terminal voltage is fed back to the input of the bias voltage regulator circuit of the input circuit according to an electric potential difference between the anode electric potential of the first diode and the anode electric potential of the second diode to limit the operations of the output circuit.

A high frequency amplifier according to the ninth aspect of the present invention, in which an input circuit of a first transistor for high frequency amplification and an input circuit of a second transistor for high frequency amplification are connected in parallel, a high frequency input signal is applied between the ground and the input circuits of the first and second transistors for high frequency amplification, and a high frequency output signal is outputted from one end of an output circuit in each of the first and second transistors for high frequency amplification, the output circuits being connected in parallel, wherein out of the first and second transistors for high frequency amplification, the other end of the output circuit of the first transistor for high frequency amplification is grounded, the other end of the output circuit of the second transistor for high frequency amplification is connected to the ground via a sensor element serving as a load resistance component at the frequency of the high frequency input signal, a terminal voltage of the sensor element is fed back to the input of a bias voltage regulator circuit of the input circuit in each of the first and second transistors for high frequency amplification via a nonlinear element to limit the operations of the output circuits, the sensor element is constituted of an inductance or resistor or a series circuit of an inductance and a resistor, the nonlinear element for feeding back the terminal voltage of the sensor element to the input of the bias voltage regulator circuit is a first diode biased in the forward direction, a second diode biased in the forward direction with the grounded cathode is provided in addition to the first diode, and the terminal voltage is fed back to the input of the bias voltage regulator circuit of the input circuit according to an electric potential difference between the anode electric potential of the first diode and the anode electric potential of the second diode to limit the operations of the output circuits.

A high frequency amplifier according to the tenth aspect of the present invention, wherein according to the first aspect or the second aspect, the nonlinear element for feeding back the terminal voltage of the sensor element to the input of the bias voltage regulator circuit is a diode biased in the forward direction, and the diode generates the reference voltage of the bias circuit for biasing the input circuit of the transistor for high frequency amplification.

A high frequency amplifier according to the eleventh aspect of the present invention, in which a high frequency input signal is applied between the ground and an input circuit of a transistor for high frequency amplification and a high frequency output signal is outputted from one end of an output circuit of the transistor for high frequency amplification, wherein the other end of the output circuit is connected to the ground via a sensor element serving as a load resistance component at the frequency of the high frequency input signal, a terminal voltage of the sensor element is fed back to the input of a bias voltage regulator circuit of the input circuit via a nonlinear element to limit the operations of the output circuit, the sensor element is constituted of an inductance or resistor or a series circuit of an inductance and a resistor, the nonlinear element for feeding back the terminal voltage of the sensor element to the input of the bias voltage regulator circuit is a diode biased in the forward direction, and the diode generates the reference voltage of the bias circuit for biasing the input circuit of the transistor for high frequency amplification.

A high frequency amplifier according to the twelfth aspect of the present invention, in which an input circuit of a first transistor for high frequency amplification and an input circuit of a second transistor for high frequency amplification are connected in parallel, a high frequency input signal is applied between the ground and the input circuits of the first and second transistors for high frequency amplification, and a high frequency output signal is outputted from one end of an output circuit in each of the first and second transistors for high frequency amplification, the output circuits being connected in parallel, wherein out of the first and second transistors for high frequency amplification, the other end of the output circuit of the first transistor for high frequency amplification is grounded, the other end of the output circuit of the second transistor for high frequency amplification is connected to the ground via a sensor element serving as a load resistance component at the frequency of the high frequency input signal, a terminal voltage of the sensor element is fed back to the input of a bias voltage regulator circuit of the input circuit in each of the first and second transistors for high frequency amplification via a nonlinear element to limit the operations of the output circuits, the sensor element is constituted of an inductance or resistor or a series circuit of an inductance and a resistor, the nonlinear element for feeding back the terminal voltage of the sensor element to the input of the bias voltage regulator circuit is a diode biased in the forward direction, and the diode generates the reference voltage of the bias circuit for biasing the input circuit of the transistor for high frequency amplification.

A high frequency amplifier according to the thirteenth aspect of the present invention, wherein according to the first aspect or the second aspect, the nonlinear element for feeding back the terminal voltage of the sensor element to the input of the bias voltage regulator circuit is a diode biased in the forward direction, and the diode is constituted of a series connection of two or more diodes or a junction diode between the base and emitter of a bipolar transistor.

A high frequency amplifier according to the fourteenth aspect of the present invention, in which a high frequency input signal is applied between the ground and an input circuit of a transistor for high frequency amplification and a high frequency output signal is outputted from one end of an output circuit of the transistor for high frequency amplification, wherein the other end of the output circuit is connected to the ground via a sensor element serving as a load resistance component at the frequency of the high frequency input signal, a terminal voltage of the sensor element is fed back to the input of a bias voltage regulator circuit of the input circuit via a nonlinear element to limit the operations of the output circuit, the sensor element is constituted of an inductance or resistor or a series circuit of an inductance and a resistor, the nonlinear element for feeding back the terminal voltage of the sensor element to the input of the bias voltage regulator circuit is a diode biased in the forward direction, and the diode is constituted of a series connection of two or more diodes or a junction diode between the base and emitter of a bipolar transistor.

A high frequency amplifier according to the fifteenth aspect of the present invention, in which an input circuit of a first transistor for high frequency amplification and an input circuit of a second transistor for high frequency amplification are connected in parallel, a high frequency input signal is applied between the ground and the input circuits of the first and second transistors for high frequency amplification, and a high frequency output signal is outputted from one end of an output circuit in each of the first and second transistors for high frequency amplification, the output circuits being connected in parallel, wherein out of the first and second transistors for high frequency amplification, the other end of the output circuit of the first transistor for high frequency amplification is grounded, the other end of the output circuit of the second transistor for high frequency amplification is connected to the ground via a sensor element serving as a load resistance component at the frequency of the high frequency input signal, a terminal voltage of the sensor element is fed back to the input of a bias voltage regulator circuit of the input circuit in each of the first and second transistors for high frequency amplification via a nonlinear element to limit the operations of the output circuits, the sensor element is constituted of an inductance or resistor or a series circuit of an inductance and a resistor, the nonlinear element for feeding back the terminal voltage of the sensor element to the input of the bias voltage regulator circuit is a diode biased in the forward direction, and the diode is constituted of a series connection of two or more diodes or a junction diode between the base and emitter of a bipolar transistor.

A high frequency amplifier according to the sixteenth aspect of the present invention includes high frequency amplifier circuits connected in multiple stages, the circuit applying a high frequency input signal between the ground and an input circuit of a transistor for high frequency amplification and outputting a high frequency output signal from one end of an output circuit of the transistor for high frequency amplification, wherein out of the high frequency amplifier circuits, the other end of the output circuit of a specific high frequency amplifier circuit is grounded via a sensor element serving as a load resistance component at the frequency of the high frequency input signal, and a terminal voltage of the sensor element is fed back to the input of a bias voltage regulator circuit in an input circuit of the other high frequency amplifier circuit to limit the operations of the output circuit.

According to the present invention, a high frequency voltage generated in a sensor element between the ground and the output circuit of a transistor for high frequency amplification is fed back to an input bias circuit. Thus, when overcurrent flows through the transistor, it is possible to quickly reduce an input voltage, thereby preventing a breakdown caused by overcurrent in the transistor without degrading the high frequency characteristic of an amplifier.

BRIEF DESCRIPTION OF THE DRAWINGS

FIG. 16 is a structural diagram showing a high frequency amplifier according to (Embodiment 6) of the present invention;

FIG. 22 is a structural diagram showing a high frequency amplifier of a third conventional example.

DESCRIPTION OF THE EMBODIMENTS (Embodiment 1)

FIGS. 1 to 7 show (Embodiment 1) of the present invention.

Figure 1:
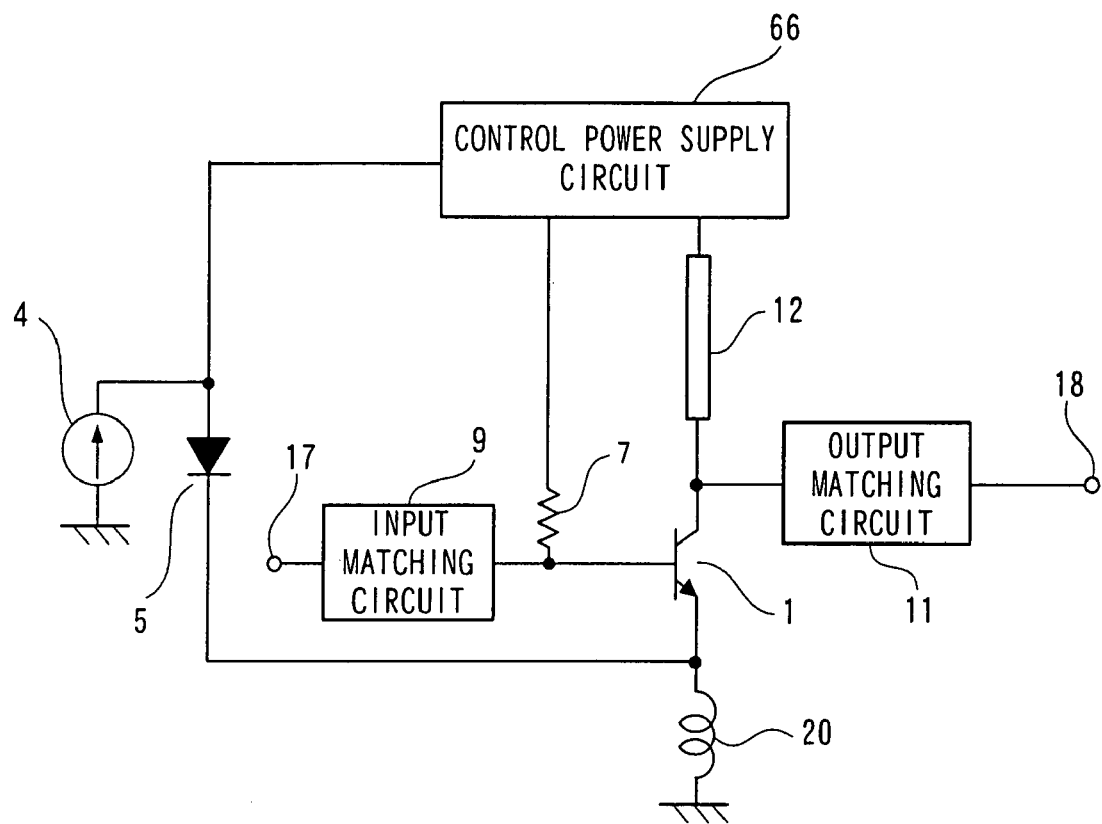
FIG. 1 is a structural diagram showing a main part of a high frequency amplifier according to (Embodiment 1) of the present invention.

FIG. 1 shows a conceptual diagram showing a high frequency amplifier of the present invention.

A high frequency input signal is inputted from a high frequency power input terminal 17 and is supplied to an input circuit between a base and an emitter of a bipolar transistor 1 for high frequency amplification.

The output circuit of the bipolar transistor 1 for high frequency amplification is configured between a collector and the emitter. An amplified high frequency signal is outputted from the collector serving as one end of the output circuit and outputted from a high frequency power output terminal 18. An input matching circuit 9 and an output matching circuit 11 are similar to those of the conventional example. An input bias voltage is applied from a control power supply circuit 66, which acts as a bias voltage regulator circuit, to the base of the transistor 1 via a resistor 7. A voltage is applied from the control power supply circuit 66 to the collector of the transistor 1 via a collector power supply circuit 12 such as a λ/4 wavelength line.

The emitter of the transistor 1 is grounded via an inductance 20 which is a sensor element acting as a load resistance component at the frequency of the high frequency input signal. The terminal voltage of an inductance 20 is fed back to the input of the bias voltage regulator circuit of the transistor 1 via a diode 5 as a nonlinear element for generating the reference voltage, so that the operations of the transistor 1 are limited. Reference numeral 4 denotes a constant current source circuit.

Referring to the operation explanatory drawings of FIGS. 2 to 5, the following will describe the operation principle of FIG. 1.

Figure 2:
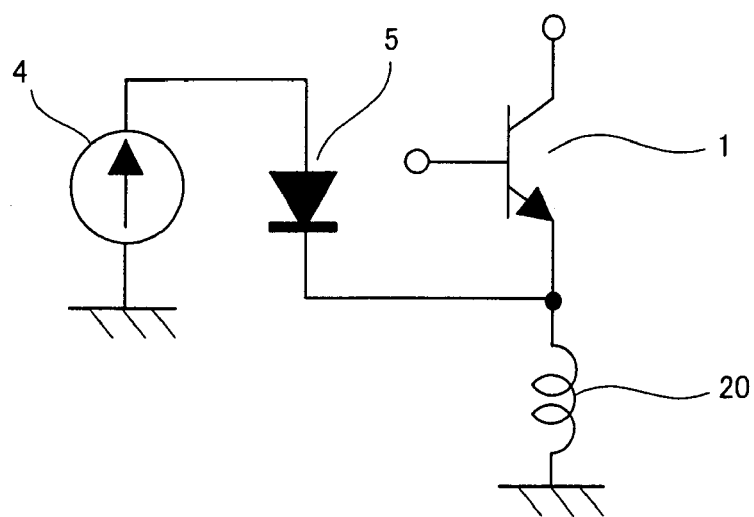
FIG. 2 is a structural diagram showing the main part according to the embodiment.

FIG. 2 is a circuit diagram in which the inductance 20 is used as a sensor element. An amplified collector current passes through the emitter in response to a high frequency signal inputted from the base of the transistor 1, and an emitter current having an almost equal high frequency amplitude is generated across the inductance 20.

Figure 3A:
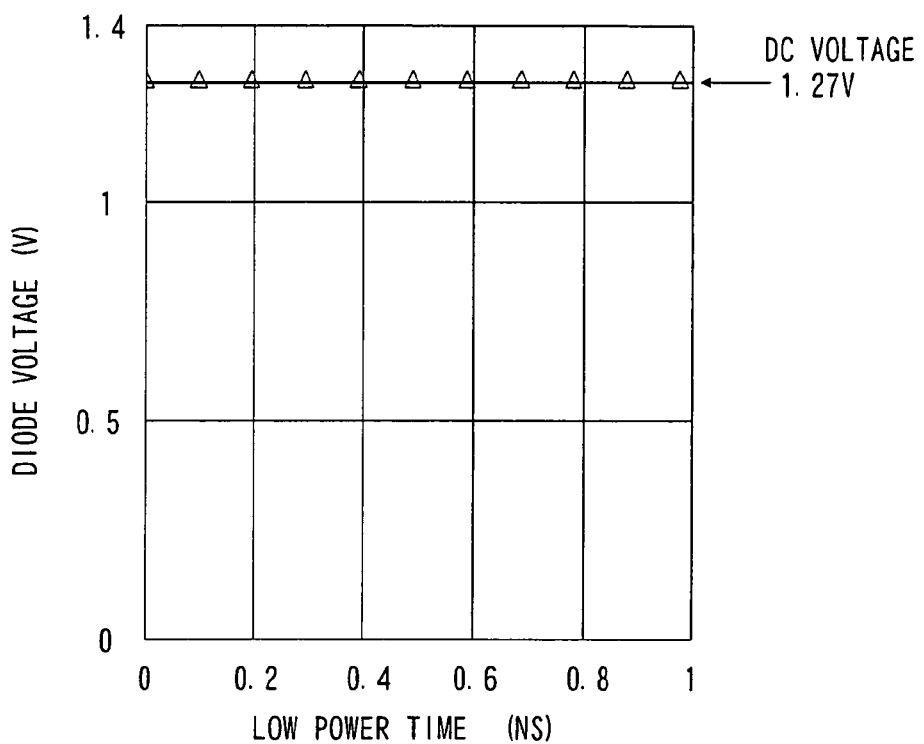
FIGS. 3A and 3B are explanatory drawings showing an electric potential difference across a diode 5 in the embodiment.
Figure 3B:
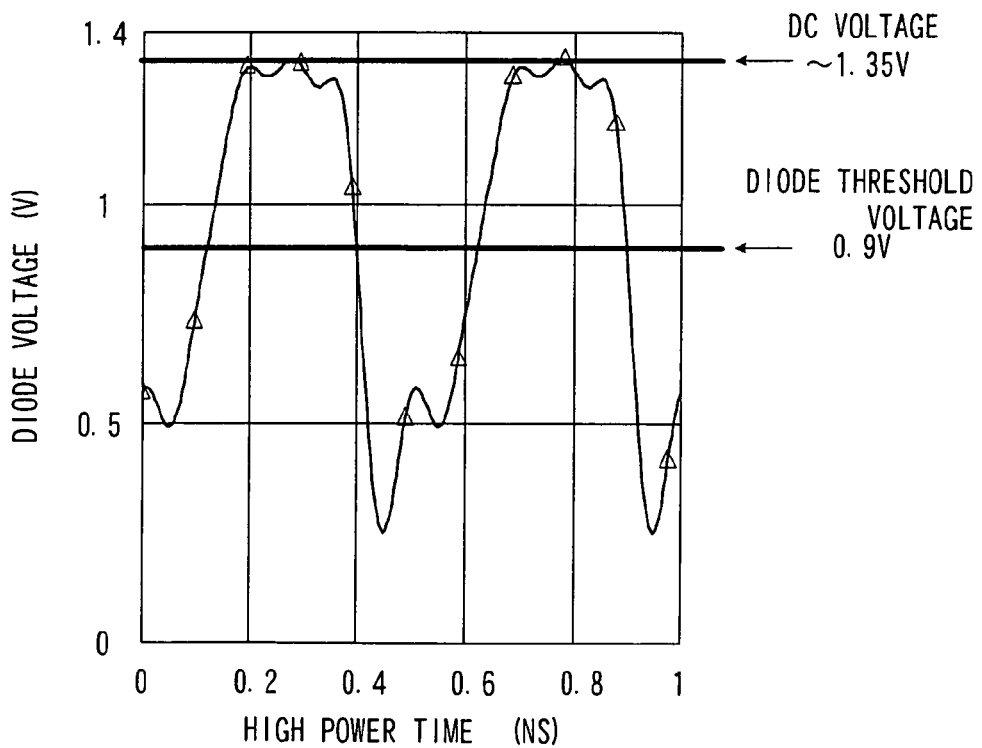
Figure 4:
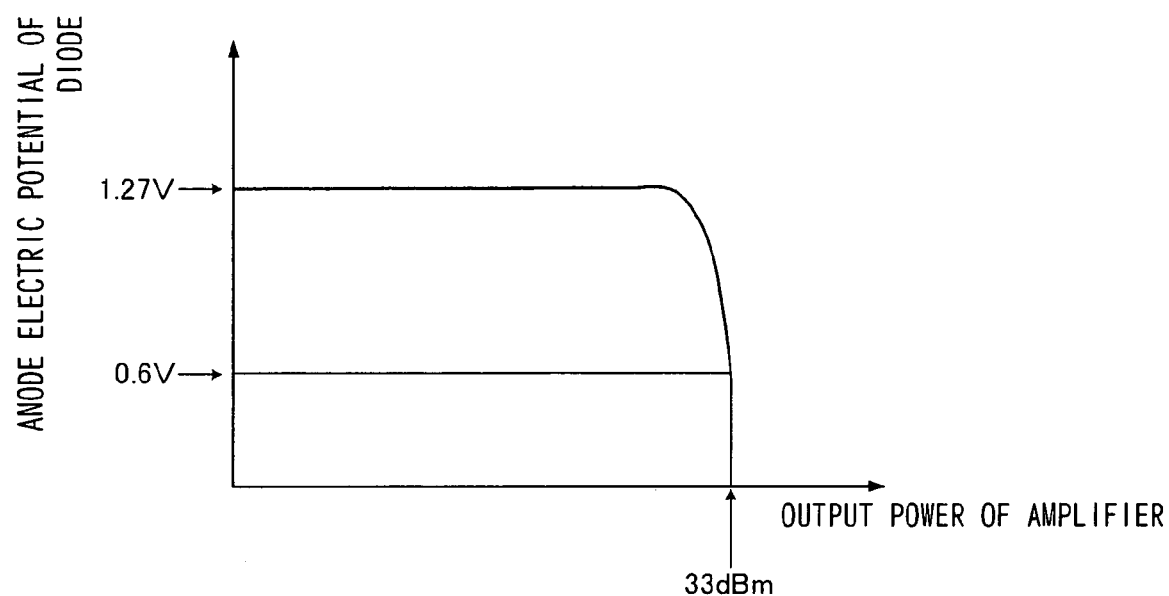
FIG. 4 is an explanatory drawing showing an output power and an anode electric potential of the diode 5 according to the embodiment.

The emitter of the transistor 1 and the cathode of the diode 5, which has been biased in the forward direction by the constant current source 4, are connected to each other and grounded via the inductance 20, resulting in an electric potential difference having a high frequency amplitude across the diode 5. At this point, due to a capacitance to the ground on the anode of the diode 5 and the nonlinearity of the diode, a voltage amplitude decreases in such a way that the anode electric potential of the diode 5 is clipped by the threshold voltage of the diode 5. The time waveform of a voltage generated across the diode 5 and a direct-current component are shown in FIGS. 3A and 3B. A direct-current electric potential difference across the diode decreases at high power. The direct-current electric potential difference across the inductance 20 is 0. That is, as shown in FIG. 4, the anode of the diode 5 decreases in electric potential as the transistor 1 increases in output power, and the electric potential is rapidly reduced by the nonlinearity of the diode as the output power increases.

Figure 5A:
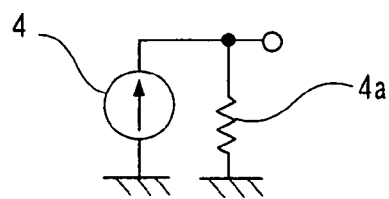
FIGS. 5A and 5B are equivalent circuit diagrams showing a constant current source 4 and a voltage source 13 according to the embodiment.
Figure 5B:
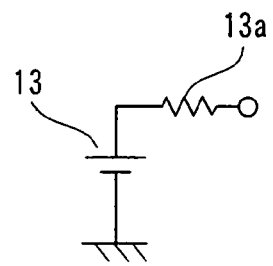

The constant current source 4 is used as the bias of the diode in the present embodiment. Also a constant voltage source can enable similar operations by substituting voltage for current. It is needless to say that the same effect can be obtained in an unideal state where the constant current source 4 has an internal resistor 4a as shown in FIG. 5A or a voltage source 13 has an internal resistor 13a as shown in FIG. 5B.

In this way, the emitter of the transistor 1 and the cathode of the diode 5 for generating the reference voltage are grounded via the inductance 20 in the high frequency amplifier of FIG. 1. Thus, as shown in FIG. 2, the anode of the diode 5 decreases in electric potential as the output power of the transistor 1 increases. The bias state of the transistor 1 can be controlled through the resistor 7 and the collector power supply circuit 12 such as a λ/4 wavelength line according to the output power level by the control power supply circuit 66, which outputs a desired voltage while using the anode electric potential of the diode 5 as a control signal.

Figure 6:
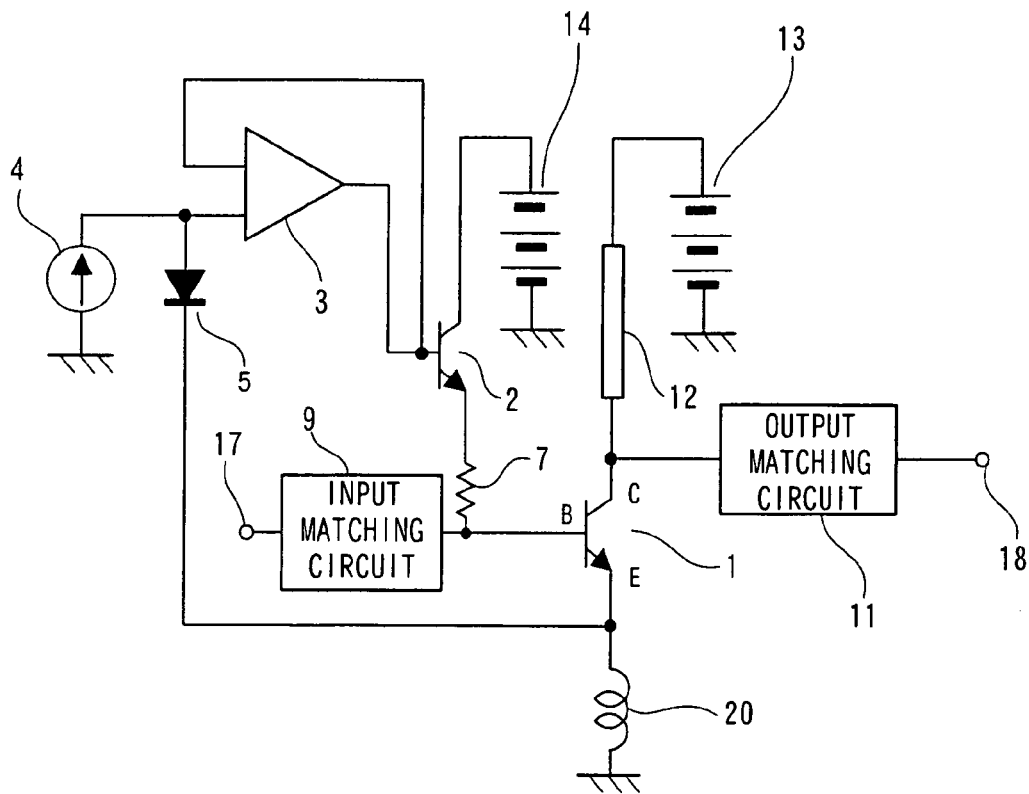
FIG. 6 is a circuit diagram showing the high frequency amplifier according to the embodiment.

More specifically, FIG. 6 shows the high frequency amplifier of FIG. 1 in use for an actual circuit.

A high frequency input signal is inputted from the high frequency power input terminal 17 to the base of the transistor 1, is outputted from the collector thereof, and is outputted from the high frequency power output terminal 18. A bias is supplied by the voltage source 13 to the collector of the transistor 1 through the collector power supply circuit 12 such as a λ/4 wavelength line. The base voltage of a bipolar transistor 2 for bias supply is adjusted by an operational amplifier circuit 3 in such a way that the base voltage of the bipolar transistor 1 for high frequency amplification is equal to a voltage generated in the diode 5 for generating the reference voltage. The transistor 2 supplies base bias to the transistor 1 by means of an emitter follower and the diode 5 has been biased by the constant current source 4. The bias current of the bipolar transistor 1 for high frequency amplification is adjusted by the constant current source 4. The resistor 7 suppresses excessive base current of the bipolar transistor 1 for high frequency amplification. The resistor 7 may be omitted in the present embodiment.

Reference numeral 14 denotes a voltage source for supplying the collector bias of the bipolar transistor 2 for bias supply. Reference numeral 17 denotes the high frequency power input terminal and reference numeral 18 denotes the high frequency power output terminal. The emitter of the transistor 1 and the cathode of the diode 5 for generating the reference voltage are grounded via the inductance 20. Thus, as shown in FIG. 2, the anode of the diode 5 decreases in electric potential as the output power of the transistor 1 increases.

The base electric potential of the bipolar transistor 2 for bias supply is outputted by the operational amplifier circuit 3 and is adjusted in such a way that the base electric potential of the transistor 1 and the anode electric potential of the diode 5 are equal to each other, so that the operations of the transistor 1 are limited.

Since the diode of a nonlinear element is used, it is possible to quickly limit the operations of the transistor 1 in response to an increased collector current.

Figure 7:
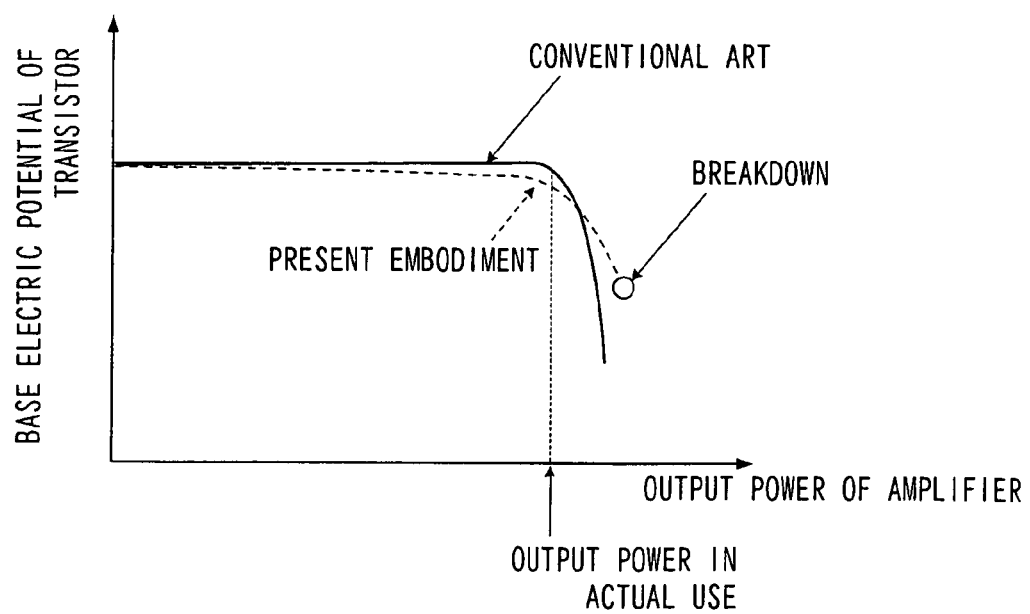
FIG. 7 is a simulation diagram showing comparisons of voltage fluctuations on a base terminal of the high frequency transistor according to the embodiment.

FIG. 7 shows simulation results on comparisons of voltage fluctuations on the base terminal of a high frequency amplifier transistor between the conventional base resistor and the present embodiment. In the present embodiment, a base voltage rapidly decreases at high power, and the base voltage is forcibly interrupted and thus no breakdown occurs when the collector current is rapidly increased by fluctuations in the output load of the amplifier.

As described above, the present embodiment makes it possible to readily control a base voltage rapidly increasing according to an increased collector current of the transistor for high frequency amplification and improve resistance to breakdown in the high frequency amplifier.

(Embodiment 2)

Figure 8:
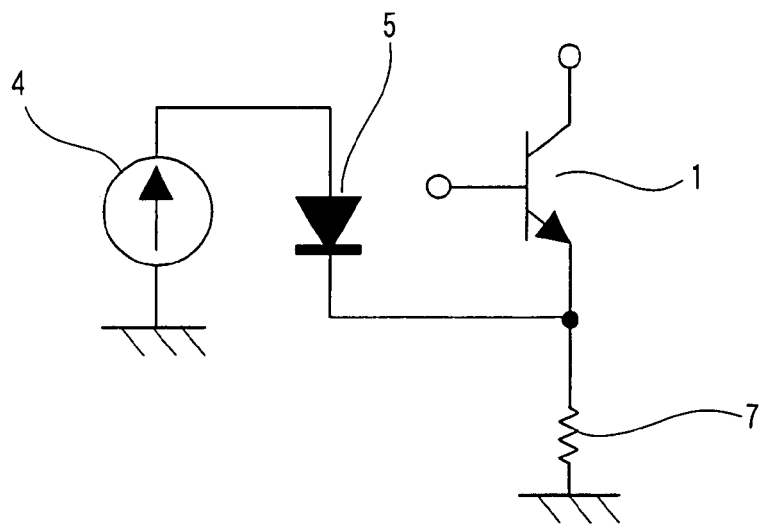
FIG. 8 is a structural diagram showing a main part of a high frequency amplifier according to (Embodiment 2) of the present invention.

FIG. 8 shows the main part of a high frequency amplifier according to (Embodiment 2) of the present invention. Other configurations are similar to those of (Embodiment 1).

In FIG. 8, a resistor 70 is used as a sensor element. Operation principles will be discussed below.

Figure 9:
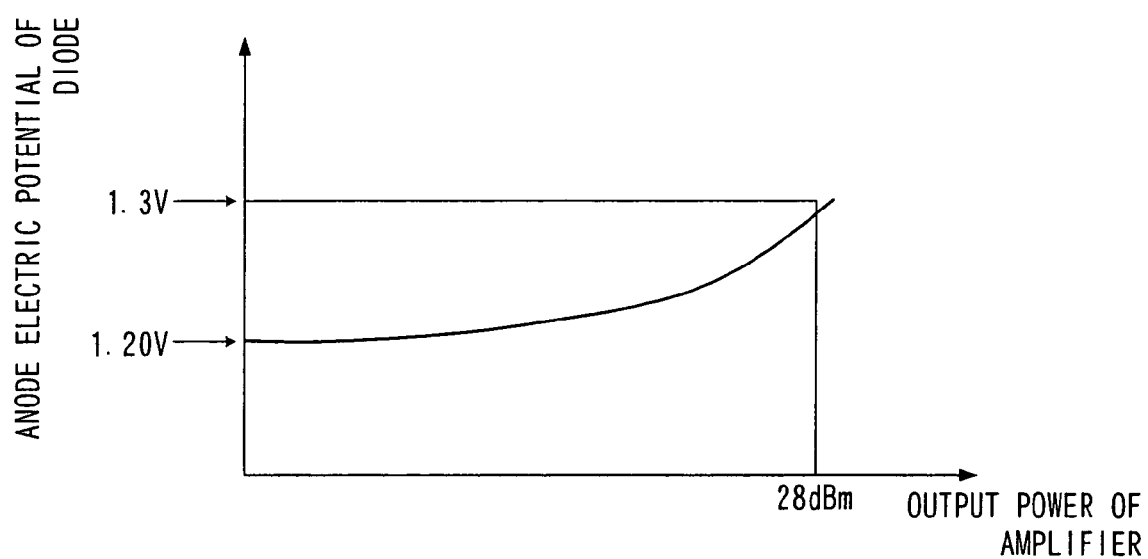
FIG. 9 is an explanatory drawing showing an anode electric potential of a diode 5 relative to an output power in the embodiment.

An amplified corrector current is outputted in response to a high frequency signal inputted from the base of a transistor 1. An emitter current having an almost equal high frequency amplitude is generated across the resistor 70. When the direct-current components of the emitter current increase according to an increase in output power, the voltage generated across the resistor 70 also increases. A diode 5 is biased by a constant current source 4 and a constant voltage is generated across the diode 5. Thus, the anode electric potential of the diode 5 is the sum of the voltage across the diode 5 and the voltage across the resistor 70. That is, as shown in FIG. 9, the anode electric potential of the diode 5 increases with the output power of the transistor 1. When a resistance value is large and the diode has nonlinearity due to high frequency amplification discussed in (Embodiment 1), the anode electric potential decreases at high power. However, the amplifier cannot have high power due to a resistance loss on the emitter.

According to the present embodiment, it is possible to achieve a high frequency amplifier which controls the bias current of a high frequency transistor in the high frequency amplifier according to an output power, for example, a high frequency amplifier having a continuous bias current control function, by which the bias current of the transistor is reduced to have smaller current consumption at low output power and the bias current of the transistor is increased to have higher output at high output power.

The constant current source is used as the bias of the diode in the present embodiment. Also a constant voltage source can enable similar operations by substituting voltage for current. Needless to say, the same effect can be obtained even when the power supply is not ideal as shown in FIG. 5A or 5B of (Embodiment 1).

(Embodiment 3)

Figure 10:
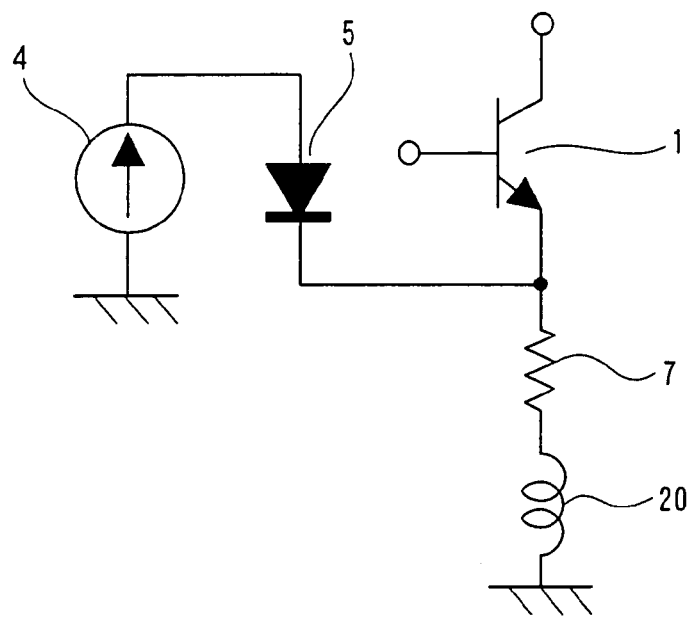
FIG. 10 is a structural diagram showing a main part of a high frequency amplifier according to (Embodiment 3) of the present invention.

FIG. 10 shows the main part of a high frequency amplifier according to (Embodiment 3) of the present invention. Other configurations are similar to those of (Embodiment 1).

In FIG. 10, a series circuit of a resistor 70 and an inductance 20 is used as a sensor element. Operation principles will be discussed below.

Figure 11:
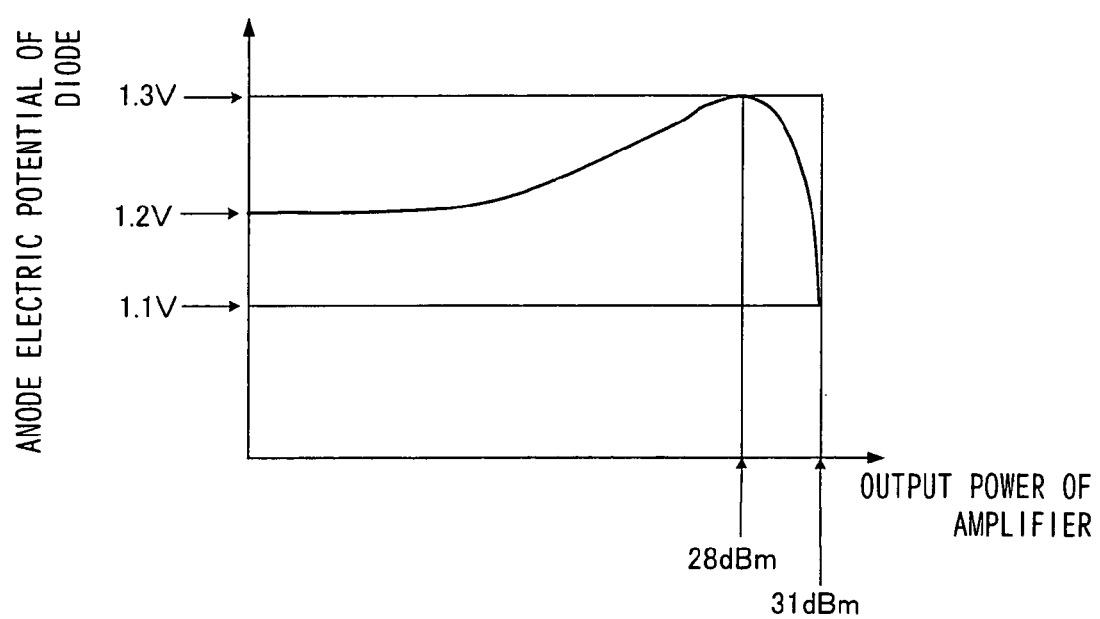
FIG. 11 is an explanatory drawing showing an anode electric potential of a diode 5 relative to an output power according to the embodiment.

An amplified corrector current is outputted in response to a high frequency input signal inputted from the base of a transistor 1. An emitter current having an almost equal high frequency amplitude is generated across the series circuit of the resistor 70 and the inductance 20. When the high frequency amplitude and direct-current components of the emitter current increase according to an increase in output power, as discussed in (Embodiment 1) and (Embodiment 2), the anode electric potential of the diode 5 at low output power increases with output due to the effect of the resistor 70, whereas the anode electric potential at high power decreases with increase in output due to the capacitance of the anode to the ground and the nonlinear effect of the diode. FIG. 11 shows the characteristic.

According to the present embodiment, it is possible to achieve a high frequency amplifier which controls the bias current of a high frequency transistor in the high frequency amplifier according to an output power as discussed in (Embodiment 2). For example, it is possible to achieve high resistance to breakdown at high power as discussed in (Embodiment 1), in a high frequency amplifier having a continuous bias current control function by which the bias current of the transistor is reduced to have smaller current consumption at low output power and the bias current of the transistor is increased to have higher output at high output power.

The constant current source is used as the bias of the diode in the present embodiment. Also a constant voltage source can enable similar operations by substituting voltage for current. Needless to say, the same effect can be obtained even when the power supply is not ideal as shown in FIG. 5A or 5B of (Embodiment 1).

(Embodiment 4)

Figure 12:
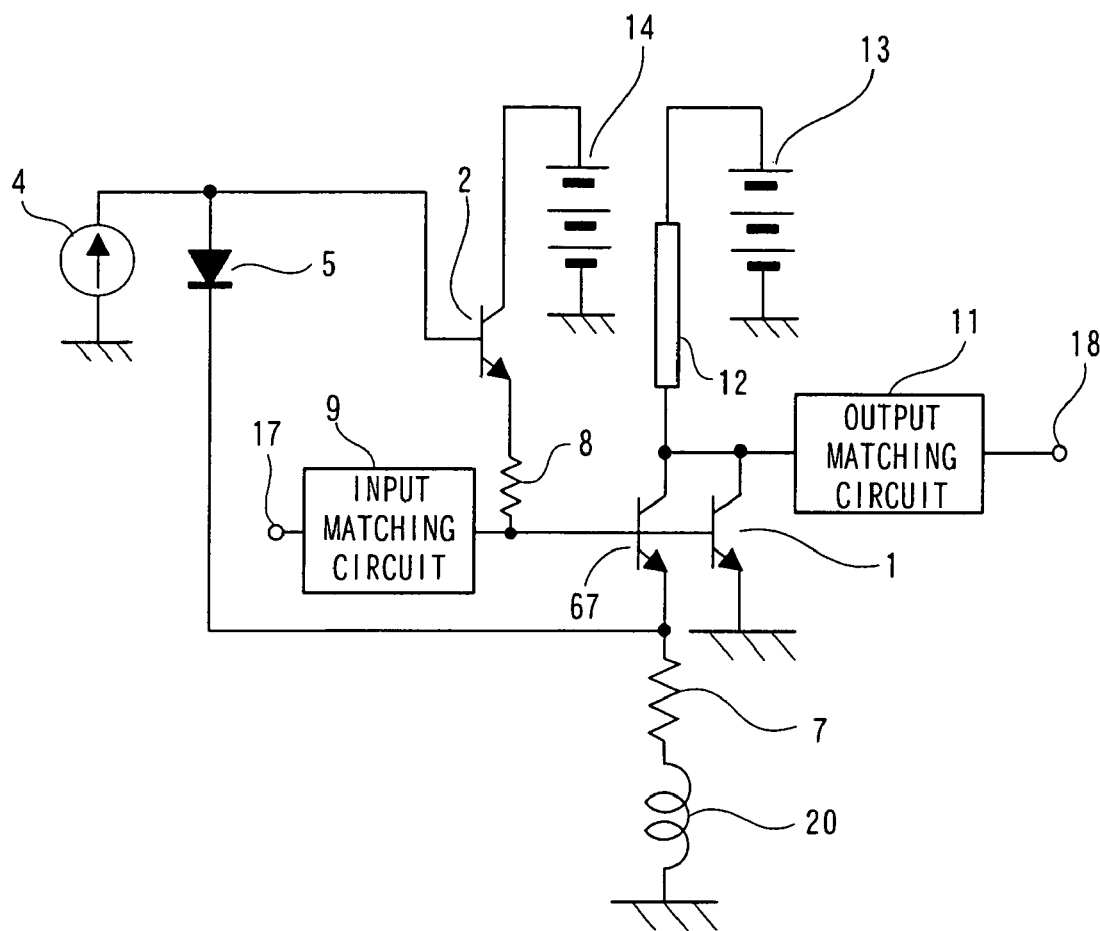
FIG. 12 is a structural diagram showing a high frequency amplifier according to (Embodiment 4) of the present invention.
Figure 13:
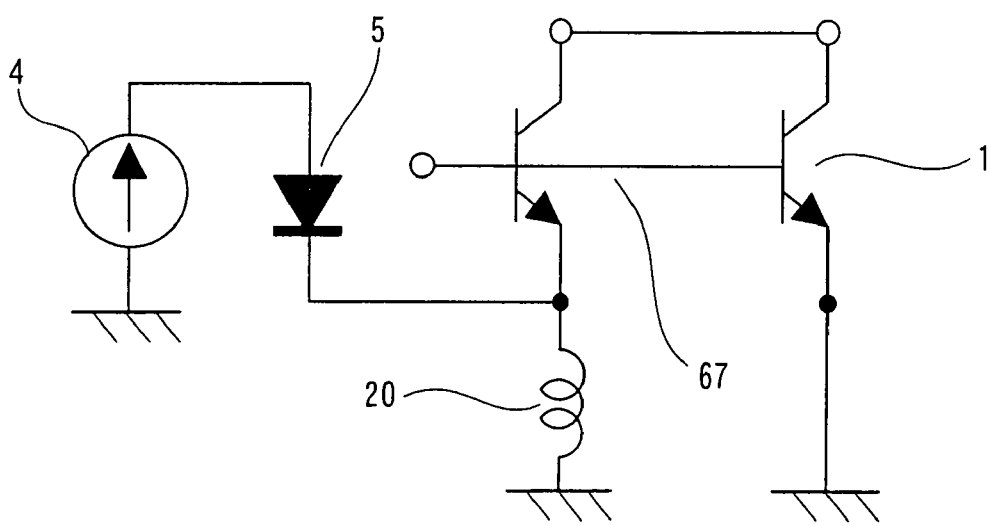
FIG. 13 is a structural diagram showing a main part of the high frequency amplifier according to the embodiment.

FIG. 12 shows a high frequency amplifier of (Embodiment 4). FIG. 13 shows them a in part thereof. Constituent elements with the same actions as (Embodiment 1) will be indicated by the same reference numerals.

The bases of transistors 1 and 67 for high frequency amplification are connected to each other and the collectors thereof are also connected to each other. The emitter of the transistor 1 is grounded, and the emitter of the transistor 67 and the cathode of a diode 5 having been biased in the forward direction by a constant current source 4 are grounded via an inductance 20.

The characteristic of a high frequency amplifier is degraded by excessive resistance or inductance between the ground and the emitter or source of a high frequency transistor used for the high frequency amplifier. The present embodiment has an advantage that the transistor 1 for main amplification has a large emitter area and the transistor 67 for sub amplification and output power detection has a small emitter area, so that output power can be detected without degrading the characteristic of the high frequency amplifier. The same effect can be obtained by using a resistor or a series circuit of a resistor and an inductance instead of the inductance of the present embodiment.

A constant current source 4 is used as the bias of the diode 5 in the present embodiment. Also a constant voltage source can enable similar operations by substituting voltage for current. Needless to say, the same effect can be obtained even when the power supply is not ideal as shown in FIG. 5A or 5B of (Embodiment 1).

FIG. 12 shows an actual circuit using the configuration of FIG. 13. A series circuit of a resistor 70 and the inductance 20 is used as a sensor element. As described above, the transistor 1 for main amplification has a large emitter area and the transistor 67 for sub amplification and output power detection has a small emitter area. The emitter of the transistor 1 is grounded, and the emitter of the transistor 67 and the cathode of the diode 5 having been biased in the forward direction by the constant current source 4 are grounded via the series circuit of the resistor 70 and the inductance 20.

A high frequency input signal is inputted from a high frequency power input terminal 17 to the bases of the transistors 1 and 67, is outputted from the connected collectors, and is outputted from a high frequency power output terminal 18. An input matching circuit 9 and an output matching circuit 11 are similar to those of the conventional example.

A bias is supplied by a voltage source 13 to the collector of the bipolar transistor 1 for high frequency amplification through a collector power supply circuit 12 such as a $\lambda/4$ wavelength line.

The base voltage of a bipolar transistor 2 for bias supply is supplied by the diode 5 for generating the reference voltage. The transistor 2 supplies the base bias to the two transistors 1 and 67 by means of an emitter follower and the diode 5 has been biased by the constant current source 4. The bias current of the two transistors 1 and 67 is adjusted by the constant current source 4. A resistor 8 suppresses excessive base current of the transistor 1. The resistor 8 may be omitted in the present embodiment.

Reference numeral 14 denotes a voltage source for supplying a collector bias to the bipolar transistor 2 for bias supply. Reference numeral 17 denotes the high frequency power input terminal and reference numeral 18 denotes the high frequency power output terminal. The emitter of the transistor 67 and the cathode of the diode 5 for generating the reference voltage are grounded via the series circuit of the resistor 70 and the inductance 20. Thus, as discussed in (Embodiment 3), the anode electric potential of the diode 5 increases with the output power of the transistor 1 and the electric potential decreases at high power. The anode electric potential of the diode 5 determines the base electric potential of the bipolar transistor 2 for bias supply. Thus, it is possible to achieve high resistance to breakdown at high power as (Embodiment 1) in a high frequency amplifier having a continuous bias current control function discussed in (Embodiment 2), in which the bias current of the transistor is reduced to have smaller current consumption at low output power, and the bias current of the transistor is increased to have higher output at high output power. In addition, the output power of the high frequency amplifier is detected by the transistor 67 having a small emitter size and the characteristic of the high frequency amplifier is determined by the transistor 1, so that a preferred high frequency characteristic can be obtained without being affected by the inductance or the resistor.

(Embodiment 5)

Figure 14:
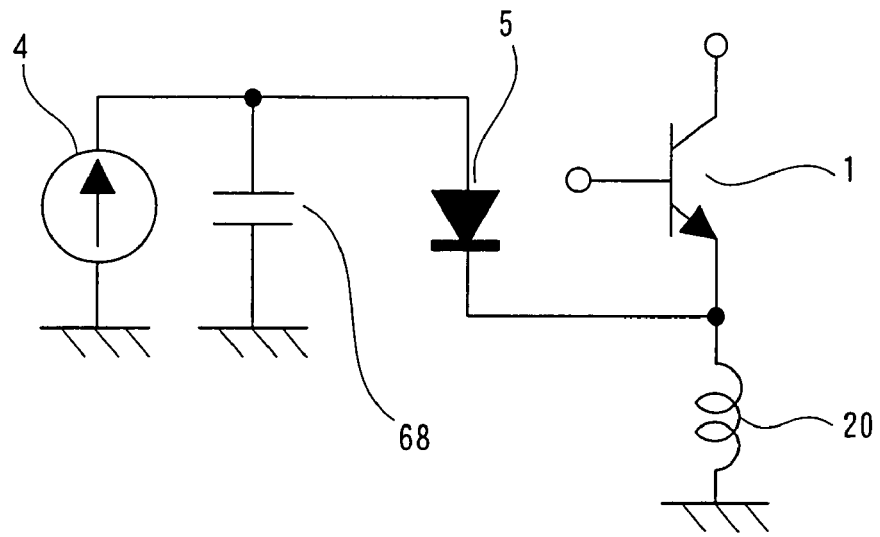
FIG. 14 is a structural diagram showing a main part of a high frequency amplifier according to (Embodiment 5) of the present invention.

FIG. 14 shows the operation principles of (Embodiment 5) of the present invention. Other configurations are similar to those of the foregoing embodiments.

An amplified collector current is outputted in response to a high frequency input signal inputted from the base of a bipolar transistor 1 for high frequency amplification. The emitter of the transistor 1 and the cathode of a diode 5 having been biased in the forward direction by a constant current source 4 are connected to each other and are grounded via an inductance 20. The anode of the diode 5 is grounded via a capacitor 68.

Figure 15:
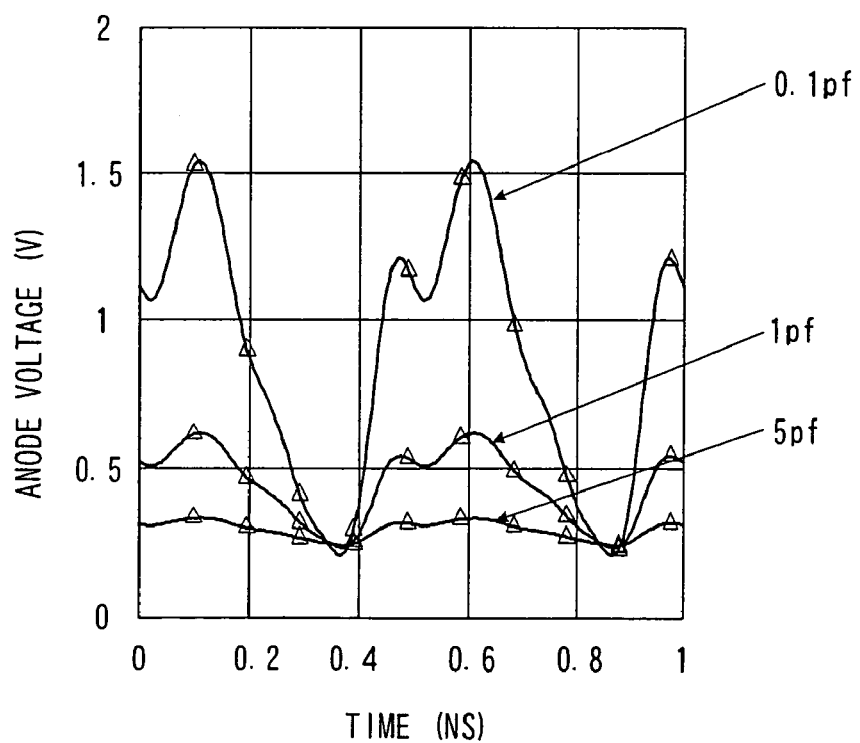
FIG. 15 is an explanatory drawing showing a time waveform of an anode electric potential and fluctuations in direct-current component when the grounding capacitance of the diode is changed according to the embodiment.

In (Embodiment 5), a parasitic component generated by the structure of the diode is used for a capacitance between the ground and the anode of the diode 5. FIG. 15 shows the time waveform of an anode electric potential and changes of a direct-current component when the diode is changed in capacitance to the ground. In FIG. 15, the capacitor for grounding the anode has values of 0.1 pf (anode DC electric potential of 1.0 V at 5 dB gain compression), 1 pf (anode DC electric potential of 0.44 V at 5 dB gain compression), and 5 pf (anode DC electric potential of 0.30 V at 5 dB gain compression). The high frequency amplitude of the anode electric potential decreases with increase in the value of the capacitor for grounding the anode, thereby reducing the anode electric potential more effectively than (Embodiment 1). Another advantage is that the anode electric potential corresponding to the output power can be obtained by the direct-current component. The same effect can be obtained by using a resistor or a series circuit of a resistor and an inductance instead of the inductance of the present embodiment.

The constant current source is used as the bias of the diode 5 in the present embodiment. Also a constant voltage source can enable similar operations by substituting voltage for current. Needless to say, the same effect can be obtained even when the power supply is not ideal as shown in FIG. 5A or 5B of (Embodiment 1).

(Embodiment 6)

FIG. 16 shows a high frequency amplifier according to (Embodiment 6) of the present invention. Constituent elements with the same actions as (Embodiment 1) will be indicated by the same reference numerals.

A high frequency input signal is inputted from a high frequency power input terminal 17 to the base of a bipolar transistor 1 for high frequency amplification, is outputted from the collector thereof, and is outputted from a high frequency power output terminal 18. An input matching circuit 9 and an output matching circuit 11 are similar to those of the conventional example.

The emitter of the transistor 1 and the cathode of a diode 5 for generating the reference voltage are grounded via an inductance 20.

A subtraction is performed by an operational amplifier 3 on the anode electric potential of the diode 5 and the anode electric potential of a second diode 69 which has been biased in the forward direction by a second constant current source 71. The cathode of the second diode 69 is grounded. The bias state of the bipolar transistor for high frequency amplification is controlled through a resistor 7 and a collector power supply circuit 12 such as a λ/4 wavelength line according to the output power level by a control power supply circuit 66, which outputs a desired voltage while using the output of the operational amplifier 3 as a control signal.

As described in (Embodiment 1), the anode electric potential of the diode 5 decreases with increase in the output power of the bipolar transistor 1 for high frequency amplification. By calculating a difference from the second diode 69 by means of the operational amplifier 3, it is possible to generate a control signal set at 0 in the absence of output power at positive and negative polarities.

The same effect can be obtained by using a resistor or a series circuit of a resistor and an inductance instead of the inductance 20 of the present embodiment.

The constant current source is used as the bias of the diode in the present embodiment. Also a constant voltage source can enable similar operations by substituting voltage for current. Needless to say, the same effect can be obtained even when the power supply is not ideal as shown in FIG. 5A or 5B of (Embodiment 1).

(Embodiment 6) can be readily applied to other embodiments.

(Embodiment 7)

Figure 17:
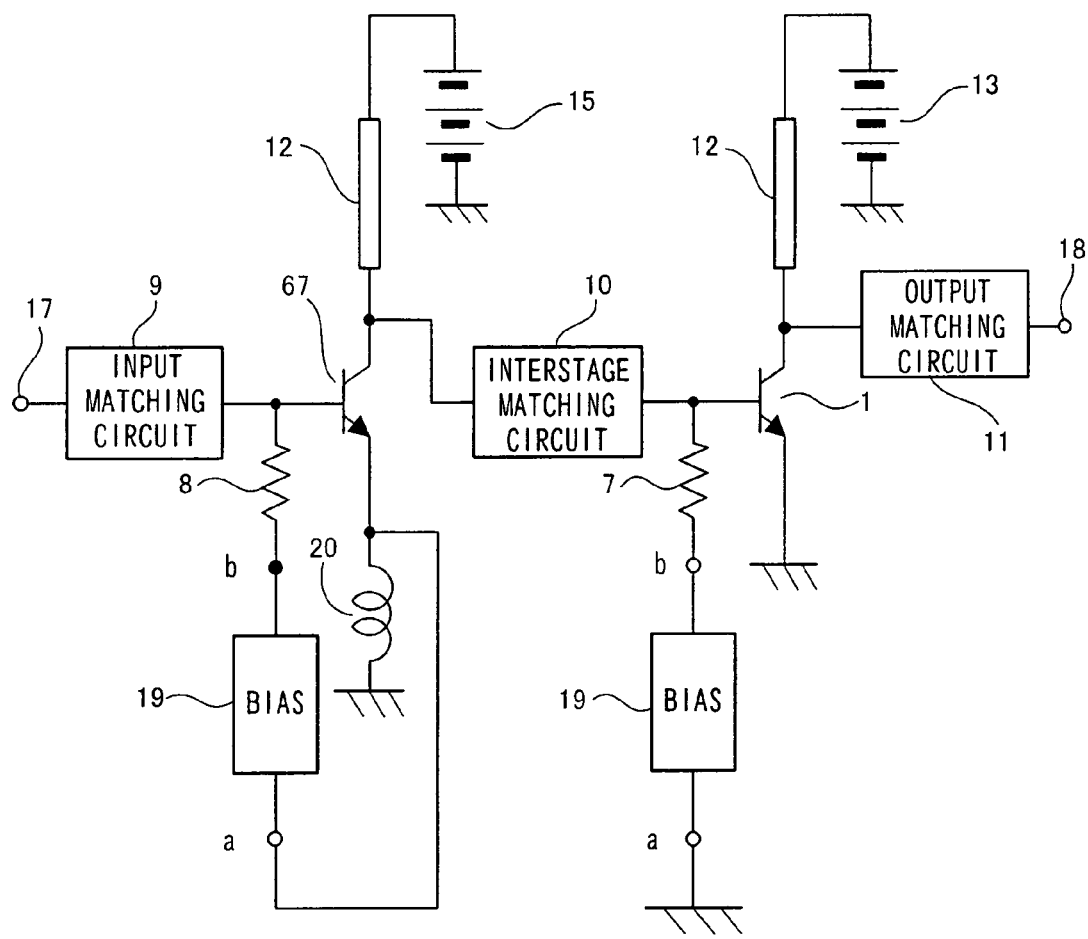
FIG. 17 is a structural diagram showing a high frequency amplifier according to (Embodiment 7) of the present invention.

FIG. 17 shows a high frequency amplifier of a two-stage configuration according to (Embodiment 7) of the present invention. A high frequency input signal is inputted from a high frequency power input terminal 17 to the base of a transistor 67 via an input matching circuit 9. An amplified signal is inputted to the base of the transistor 1 via an interstage matching circuit 10 and is outputted from a high frequency power output terminal 18 via an output matching circuit 11.

A bias is supplied by voltage sources 13 and 15 respectively to the collector of the transistor 1 and the collector of the transistor 67 through a collector power supply circuit 12 such as a λ/4 wavelength line.

Figure 18:
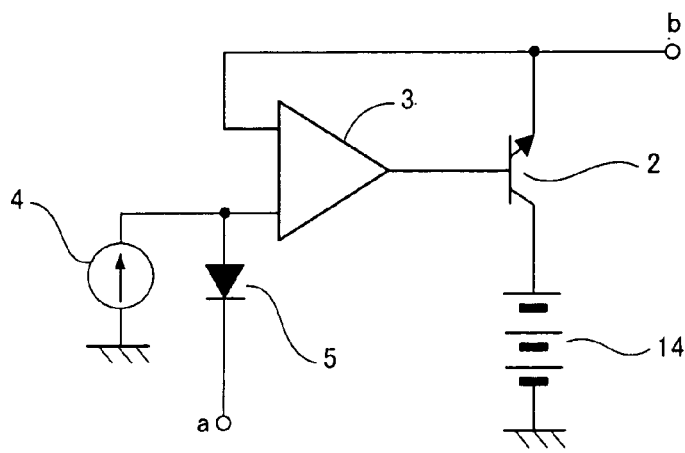
FIG. 18 is a structural diagram showing a main part of the embodiment.

As shown in FIG. 18, a base bias supply circuit 19 for the transistors 1 and 67 is constituted of a bipolar transistor 2 for bias supply that supplies base bias by means of an emitter follower, a constant current source 4, a diode 5 for generating the reference voltage, an operational amplifier circuit 3, and a voltage source 14.

Resistors 7 and 8 suppress excessive base current of the transistors 1 and 67. The resistors 7 and 8 may be omitted in the present embodiment.

The emitter of the transistor 67 for the first-stage amplification and the cathode of the diode 5 for generating the reference voltage in the bias circuit of FIG. 18 are grounded via an inductance 20. The bias circuit supplies a bias to the base of the transistor 67. As discussed in (Embodiment 1), the base electric potential of the transistor 67 decreases with increase in the output power of the second bipolar transistor 67 for high frequency amplification, thereby preventing a breakdown at excessive power.

In the present embodiment, the operations of the transistor 67 in the first stage are limited to prevent a breakdown of the transistor 1 for outputting high power in the last stage.

Further, by performing bias control on the relationship between input power and output power of the transistor in the first stage, the present embodiment is applicable to a linear amplifier capable of correcting amplitude distortion of the transistor in the last stage.

(Embodiment 8)

Figure 19:
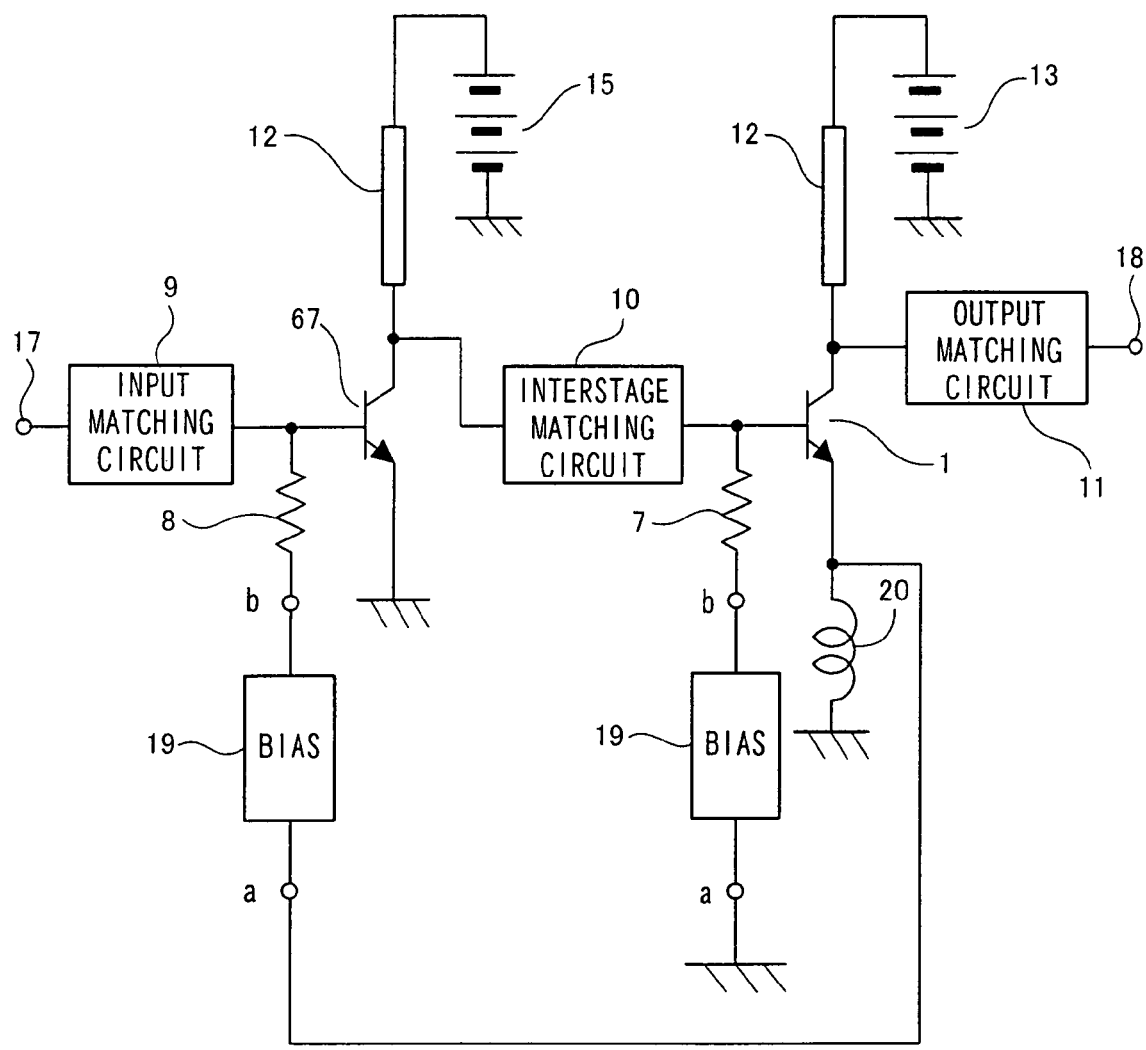
FIG. 19 is a structural diagram showing a high frequency amplifier according to (Embodiment 8) of the present invention.
Figure 20:
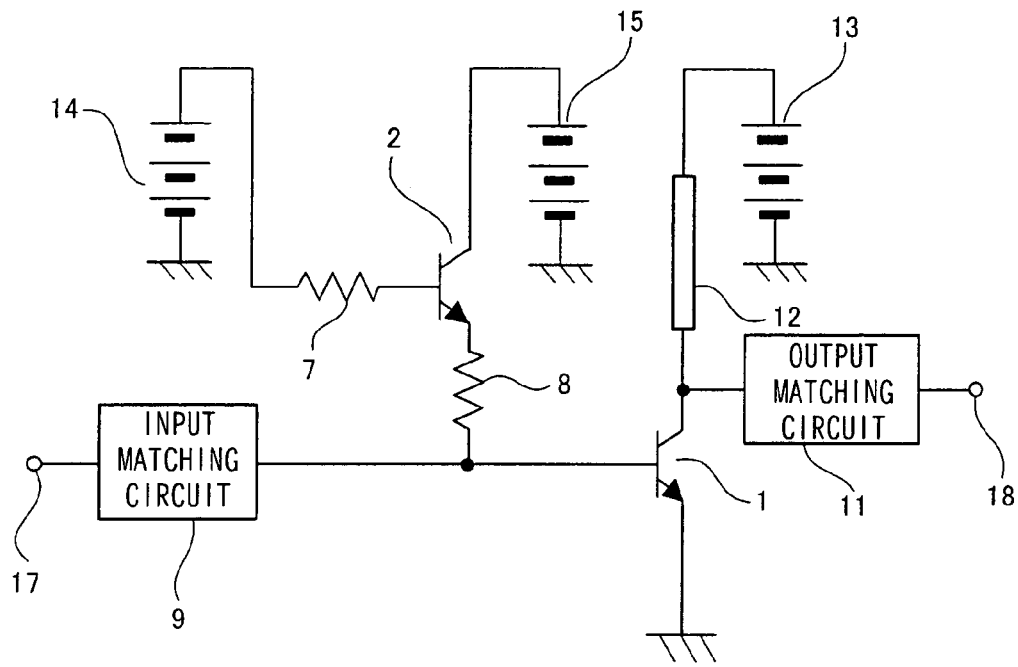
FIG. 20 is a structural diagram showing a high frequency amplifier of a first conventional example.
Figure 21:
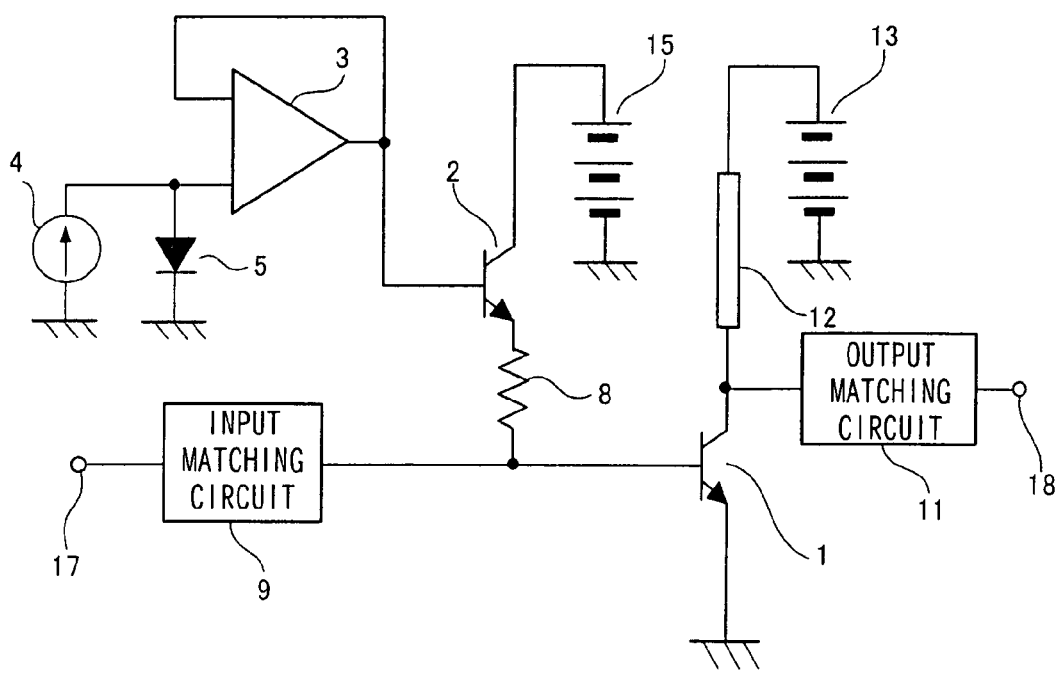
FIG. 21 is a structural diagram showing a high frequency amplifier of a second conventional example.

FIG. 19 shows a high frequency amplifier according to (Embodiment 8) of the present invention.

The high frequency amplifier has a two-stage configuration of bipolar transistors 67 and 1 for high frequency amplification. A high frequency input signal is inputted from a high frequency power input terminal 17 to the base of the transistor 67 via an input matching circuit 9. An amplified signal is inputted to the base of the transistor 1 via an interstage matching circuit 10 and is outputted from a high frequency power output terminal 18 via an output matching circuit 11.

Bias supply to the collector of the transistor 1 and the collector of the transistor 67 and a base bias supply circuit for the transistors 1 and 67 are similar to those of FIG. 17 of (Embodiment 7). Resistors 7 and 8 suppress excessive base current of the transistors 1 and 67. The resistors 7 and 8 may be omitted in the present embodiment.

The emitter of the transistor 1 for the last-stage amplification and the cathode of the diode 5 for generating the reference voltage in the bias circuit of FIG. 18 are grounded via an inductance 20. The bias circuit supplies a bias to the base of the transistor 67 in the first stage. As discussed in (Embodiment 1), the base voltage of the transistor 67 decreases with increase in the output power of the transistor 1, thereby preventing a breakdown at excessive power. In the present embodiment, the output power of the transistor 1 in the last stage is detected and the operations of the transistor 67 in the first stage are limited to prevent a breakdown of the transistor 1 for outputting high power in the last stage.

Further, by performing bias control on the relationship between input power and output power of the transistor in the first stage, the present embodiment is also applicable to a linear amplifier capable of correcting amplitude distortion of the transistor in the last stage.

The foregoing embodiments discussed examples where the transistors for high frequency amplification are bipolar. The same effect can be obtained by using a field-effect transistor. In the case of the field-effect transistor for high frequency amplification, an input circuit is formed between the gate and source of the transistor, an output circuit is formed between the drain and source of the transistor, and the sensor element is interposed between the ground and the source.

In the foregoing embodiments, the diode 5 is used as a nonlinear element. To be specific, the diode 5 is constituted of a series connection of two or more diodes or a junction diode between the base and emitter of a bipolar transistor. The same effect can be obtained by using other nonlinear elements instead of the diode.

The high frequency amplifier of the present invention can quickly reduce the bias voltage of an input circuit when overcurrent flows through a transistor for high frequency amplification. Thus, it is possible to prevent a breakdown caused by overcurrent of the transistor for high frequency amplification without degrading the high frequency characteristic of the amplifier. Hence, the present invention is useful for radio communication of a mobile telephone or the like.

What is claimed is:

1. A high frequency amplifier comprising a transistor, in which a high frequency input signal is applied between a ground and an input circuit of the transistor for high frequency amplification and a high frequency output signal is outputted from one end of an output circuit of the transistor for high frequency amplification, wherein
   the other end of the output circuit is connected to the ground via a sensor element serving as a load resistance component at a frequency of the high frequency input signal, and
   a terminal voltage of the sensor element is fed back to an input of a bias voltage regulator circuit of the input circuit via a nonlinear element to limit operations of the output circuit, the nonlinear element is a diode biased in a forward direction, and one end of the diode is grounded via a capacitor.

2. A high frequency amplifier comprising first and second transistors, in which an input circuit of the first transistor for high frequency amplification and an input circuit of the second transistor for high frequency amplification are connected in parallel, a high frequency input signal is applied between a ground and input circuits of the first and second transistors for high frequency amplification, and a high frequency output signal is outputted from one end of an output circuit in each of the first and second transistors for high frequency amplification, the output circuits being connected in parallel, wherein
   out of the first and second transistors for high frequency amplification, the other end of the output circuit of the first transistor for high frequency amplification is grounded, the other and of the output circuit of the second transistor for high frequency amplification is connected to the ground via a sensor element serving as a load resistance component at a frequency of the high frequency input signal, and
   a terminal voltage of the sensor element is fed back to an input of a bias voltage regulator circuit of the input circuit in each of the first and second transistors for high frequency amplification via a nonlinear element to limit operations of the output circuits, the nonlinear element is a diode biased in a forward direction, and one end of the diode is grounded via a capacitor.

3. The high frequency amplifier according to claim 1, wherein the sensor element is selected from the group consisting of an inductance, a resistor, and a series circuit of an inductance and a resistor.

4. A high frequency amplifier comprising a transistor, in which a high frequency input signal is applied between a ground and an input circuit of the transistor for high frequency amplification and a high frequency output signal is outputted from one end of an output circuit of the transistor for high frequency amplification, wherein
   the other end of the output circuit is connected to the ground via a sensor element serving as a load resistance component at a frequency of the high frequency input signal,
   a terminal voltage of the sensor element is fed back to an input of a bias voltage regulator circuit of the input circuit via a nonlinear element to limit operations of the output circuit,
   the sensor element is comprised of an inductance or resistor or a series circuit of an inductance and a resistor,
   the nonlinear element for feeding back the terminal voltage of the sensor element to the input of the bias voltage regulator circuit is a diode biased in a forward direction, and
   one end of the diode is grounded via a capacitor.

5. A high frequency amplifier comprising first and second transistors, in which an input circuit of the first transistor for high frequency amplification and an input circuit of the second transistor for high frequency amplification are connected in parallel, a high frequency input signal is applied between a ground and input circuits of the first and second transistors for high frequency amplification, and a high frequency output signal is outputted from one end of an output circuit in each of the first and second transistors for high frequency amplification, the output circuits being connected in parallel, wherein
   out of the first and second transistors for high frequency amplification, the other end of the output circuit of the first transistor for high frequency amplification is grounded, the other and of the output circuit of the second transistor for high frequency amplification is connected to the ground via a sensor element serving as a load resistance component at a frequency of the high frequency input signal,
   a terminal voltage of the sensor element is fed back to an input of a bias voltage regulator circuit of the input circuit in each of the first and second transistors for high frequency amplification via a nonlinear element to limit operations of the output circuits, the sensor element is comprised of an inductance or resistor or a series circuit of an inductance and a resistor, the nonlinear element for feeding back the terminal voltage of the sensor element to the input of the bias voltage regulator circuit is a diode biased in a forward direction, and one end of the diode is grounded via a capacitor.

6. The high frequency amplifier according to claim 1, wherein the nonlinear element for feeding back the terminal voltage of the sensor element to the input of the bias voltage regulator circuit is a first diode biased in a forward direction, a second diode biased in the forward direction with a grounded cathode is provided in addition to the first diode, and the terminal voltage is fed back to the input of the bias voltage regulator circuit of the input circuit according to an electric potential difference between an anode electric potential of the first diode and an anode electric potential of the second diode to limit operations of the output circuit.

7. The high frequency amplifier according to claim 1, wherein the nonlinear element for feeding back the terminal voltage of the sensor element to the input of the bias voltage regulator circuit is a diode biased in a forward direction, and the diode generates a reference voltage of a bias circuit for biasing the input circuit of the transistor for high frequency amplification.

8. A high frequency amplifier comprising a transistor, in which a high frequency input signal is applied between a ground and an input circuit of the transistor for high frequency amplification and a high frequency output signal is outputted from one end of an output circuit of the transistor for high frequency amplification, wherein the other end of the output circuit is connected to the ground via a sensor element serving as a load resistance component at a frequency of the high frequency input signal, a terminal voltage of the sensor element is fed back to an input of a bias voltage regulator circuit of the input circuit via a nonlinear element to limit operations of the output circuit, the sensor element is comprised of an inductance or resistor or a series circuit of an inductance and a resistor, the nonlinear element for feeding back the terminal voltage of the sensor element to the input of the bias voltage regulator circuit is a diode biased in a forward direction, and one end of the diode is grounded via capacitor.

the diode generates a reference voltage of a bias circuit for biasing the input circuit of the transistor for high frequency amplification.

9. A high frequency amplifier comprising first and second transistors, in which an input circuit of the first transistor for high frequency amplification and an input circuit of the second transistor for high frequency amplification are connected in parallel, a high frequency input signal is applied between a ground and the input circuits of the first and second transistors for high frequency amplification, and a high frequency output signal is outputted from one end of an output circuit in each of the first and second transistors for high frequency amplification, the output circuits being connected in parallel, wherein out of the first and second transistors for high frequency amplification, the other end of the output circuit of the first transistor for high frequency amplification is grounded, the other end of the output circuit of the second transistor for high frequency amplification is connected to the ground via a sensor element serving as a load resistance component at a frequency of the high frequency input signal, a terminal voltage of the sensor element is fed back to an input of a bias voltage regulator circuit of the input circuit in each of the first and second transistors for high frequency amplification via a nonlinear element to limit operations of the output circuits, the sensor element is comprised of an inductance or resistor or a series circuit of an inductance and a resistor, the nonlinear element for feeding back the terminal voltage of the sensor element to the input of the bias voltage regulator circuit is a diode biased in a forward direction, and the diode generates a reference voltage of a bias circuit for biasing the input circuit of the transistor for high frequency amplification.

10. The high frequency amplifier according to claim 1, wherein the nonlinear element for feeding back the terminal voltage of the sensor element to the input of the bias voltage regulator circuit is a diode biased in a forward direction, and the diode is comprised of a series connection of two or more diodes or a junction diode between a base and an emitter of a bipolar transistor.

11. A high frequency amplifier comprising a transistor, in which a high frequency input signal is applied between a ground and an input circuit of the transistor for high frequency amplification and a high frequency output signal is outputted from one end of an output circuit of the transistor for high frequency amplification, wherein the other end of the output circuit is connected to the ground via a sensor element serving as a load resistance component at a frequency of the high frequency input signal, a terminal voltage of the sensor element is fed back to an input of a bias voltage regulator circuit of the input circuit via a nonlinear element to limit operations of the output circuit, the sensor element is comprised of an inductance or resistor or a series circuit of an inductance and a resistor, the nonlinear element for feeding back the terminal voltage of the sensor element to the input of the bias voltage regulator circuit is a diode biased in a forward direction, and the diode is comprised of a series connection of two or more diodes or a junction diode between a base and an emitter of a bipolar transistor.

12. A high frequency amplifier comprising first and second transistors, in which an input circuit of a the first transistor for high frequency amplification and an input circuit of the second transistor for high frequency amplification are connected in parallel, a high frequency input signal is applied between a ground and the input circuits of the first and second transistors for high frequency amplification, and a high frequency output signal is outputted from one and of an output circuit in the first and second transistors for high frequency amplification, the output circuits being connected in parallel, wherein out of the first and second transistors for high frequency amplification, the other end of the output circuit in the first transistor for high frequency amplification is grounded, the other and of the output circuit in the second transistor for high frequency amplification is connected to the ground via a sensor element serving as a load resistance component at a frequency of the high frequency input signal, a terminal voltage of the sensor element is fed back to an input of a bias voltage regulator circuit of the input circuit in the first and second transistors for high frequency amplification via a nonlinear element to limit operations of the output circuits, the sensor element is comprised of an inductance or resistor or a series circuit of an inductance and a resistor, the nonlinear element for feeding back the terminal voltage of the sensor element to the input of the bias voltage regulator circuit is a diode biased in a forward direction, and the diode is comprised of a series connection of two or more diodes or a junction diode between a base and an emitter of a bipolar transistor.

13. A high frequency amplifier, comprising high frequency amplifier circuits connected in multiple stages, the circuit applying a high frequency input signal between a ground and an input circuit of a transistor for high frequency amplification and outputting a high frequency output signal from one end of an output circuit of the transistor for high frequency amplification, wherein out of the high frequency amplifier circuits, the other end of an output circuit of a specific high frequency amplifier circuit is grounded via a sensor element serving as a load resistance component at a frequency of the high frequency input signal, and a terminal voltage of the sensor element is fed back to an input of a bias voltage regulator circuit in an input circuit of the other high frequency amplifier circuit via a nonlinear element to limit operations of the output circuit, the nonlinear element is a diode biased in a forward direction, and one end of the diode is grounded via a capacitor.

* * * * *